United States Patent [19]
Stearns et al.

[11] Patent Number: 6,002,553
[45] Date of Patent: Dec. 14, 1999

[54] GIANT MAGNETORESISTIVE SENSOR

[75] Inventors: Daniel G. Stearns, Los Altos; Stephen P. Vernon, Pleasanton; Natale M. Ceglio, Livermore; Andrew M. Hawryluk, Modesto, all of Calif.

[73] Assignee: The United States of America as represented by the United States Department of Energy, Washington, D.C.

[21] Appl. No.: 08/202,991

[22] Filed: Feb. 28, 1994

[51] Int. Cl.[6] ....................................................... G11B 5/39
[52] U.S. Cl. ............................................................. 360/113
[58] Field of Search .......................... 324/252; 338/32 R; 360/113

[56] References Cited

U.S. PATENT DOCUMENTS

| | | |
|---|---|---|
| 5,206,590 | 4/1993 | Dieny et al. ............................. 324/252 |
| 5,287,238 | 2/1994 | Baumgart et al. ....................... 360/113 |
| 5,373,238 | 12/1994 | McGuire et al. ....................... 324/252 |
| 5,442,508 | 8/1995 | Smith ...................................... 360/113 |
| 5,452,163 | 9/1995 | Coffey et al. ........................... 360/113 |

*Primary Examiner*—Robert S. Tupper
*Attorney, Agent, or Firm*—William C. Daubenspeck; Henry Sartorio; William R. Moser

[57] ABSTRACT

A magnetoresistive sensor element with a three-dimensional micro-architecture is capable of significantly improved sensitivity and highly localized measurement of magnetic fields. The sensor is formed of a multilayer film of alternately magnetic and nonmagnetic materials. The sensor is optimally operated in a current perpendicular to plane mode. The sensor is useful in magnetic read/write heads, for high density magnetic information storage and retrieval.

19 Claims, 1 Drawing Sheet

GIANT MAGNETORESISTIVE SENSOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates generally to localized magnetic field detection and measurement and more particularly to magnetoresistive sensors.

2. Description of Related Art

Magnetic sensor technology is likely to play an enabling role in a wide variety of product applications. Advanced magnetic sensors will serve as read elements in magnetic heads for information retrieval from magnetic tape, disk and card storage media. The sensors may also serve as non-volatile information storage elements. In addition, magnetic sensors have great potential as switches and control elements in automobile engines and anti-lock braking systems as well as in medical applications to map magnetic signals from the human brain, and in underwater excavation and/or search systems to map the magnetic signature of metallic objects.

The value of magnetic sensor technology in future applications will depend in large part on the ability to develop sensors with improved sensitivity, smaller dimensions, and innovative packaging. Specifically, packaging refers to a system architecture which allows efficient signal retrieval without compromising performance or reliability.

Conventional magnetoresistive (MR) sensors use the magnetoresistance of simple thin films of ferromagnetic materials to detect and measure the local magnetic field in the environment of the sensor. Typically magnetic materials exhibit a change in electrical resistivity as the local magnetic field is changed. By passing an electrical current through the material, a change in resistivity produces a change in output voltage which is then a direct measure of the local magnetic field change. Such conventional MR sensors have been successfully used as information retrieval (i.e., read) sensor elements in magnetic heads used in magnetic disk storage devices. A magnetoresistance sensor may also be used as a reliable switching element for use as a device controller or a digital information storage element. The usefulness of conventional MR sensors is limited by the small magnitude of the MR response $$\left(\frac{\Delta R}{R}\right),$$

where $\Delta R$ is the change in resistance with and without an external saturation magnetic field and R is the resistance in the presence of the saturation magnetic field).

Recently materials with enhanced magnetoresistive response $$\left(\frac{\Delta R}{R}\right)$$

have been produced by controlling the one-dimensional micro-structure of the materials. This effect, called giant magnetoresistance (GMR), is described in the IEEE Translation Journal on Magnetics in Japan, Vol.7, No. 9, September, 1992, pages 674–684 and IEEE Transactions on Magnetics, Vol. 28, No. 5, September, 1992, pages 2482–2487. The GMR effect has been produced in synthetic multilayered structures consisting of ferromagnetic metal layers separated by non-magnetic metal layers. The thicknesses of individual layers in these structures are typically several nanometers. The origin of the giant magnetoresistive effect is related to the large difference in resistivity between the configuration in which the magnetization state of adjacent ferromagnetic layers is substantially parallel versus the configuration in which adjacent ferromagnetic layers have a substantially anti-parallel magnetization state. The observed large variations in resistivity between these two states is thought to be due to the differences in spin dependent scattering at the layer boundaries when the magnetization states of adjacent ferromagnetic layers are parallel or anti-parallel.

While GMR materials provide the opportunity for sensors with a large magnetoresistive response $$\left(\frac{\Delta R}{R}\right),$$

they typically do not have high sensitivity, $$\left(\frac{\Delta R}{R}\right)/H_{sat},$$

where:
 $\Delta R = R(\text{at } H=O) - R(\text{at } H_{sat})$
 $R = R(\text{at } H_{sat})$
 $H_{sat}$=the applied magnetic field to saturate the ferromagnetic layers.

This is because the anti-parallel magnetization state (which occurs at H=O, i.e., no applied external field) is produced by an exchange coupling between the adjacent ferromagnetic layers. The exchange coupling between adjacent ferromagnetic layers is a strong, short-range, quantum mechanical interaction. It requires a thin spacer layer between the ferromagnetic layers, and because it is so strong it demands a strong $H_{sat}$ in order to switch the sensor from the anti-parallel magnetization state to a parallel magnetization state. This is an important limitation in the practical application of GMR sensors to high density read/write magnetic heads because of the requirement to be sensitive to modest magnetic fields.

SUMMARY OF THE INVENTION

The giant magnetoresistive sensors (GMR) of the present invention are superior to other GMR sensor concepts in that they are able to achieve a strong magnetoresistive response $$\left(\frac{\Delta R}{R}\right),$$

while at the same time having high sensitivity $$\left\{\left(\frac{\Delta R}{R}\right)/H_{sat}\right\}.$$

In addition, the micro-architecture of these sensors provides the opportunity for high spatial resolution of local fields, and the innovative sensor packaging allows for simple fabrication and convenient signal retrieval and reliable performance. The improved performance and other advantages of these magnetoresistive sensors derives from its three dimensional micro-architecture and the preferred mode of current flow in operation. The invention includes the design of these magnetoresistive sensors, the techniques for their fabrication and applications for their use.

BRIEF DESCRIPTION OF THE DRAWINGS

FIGS. 3A, B are side views of a giant magnetoresistive sensor as in FIG. 1 showing additional layers and alternate electrode configurations.

DETAILED DESCRIPTION OF THE INVENTION

Sensor Design

Figure 1:
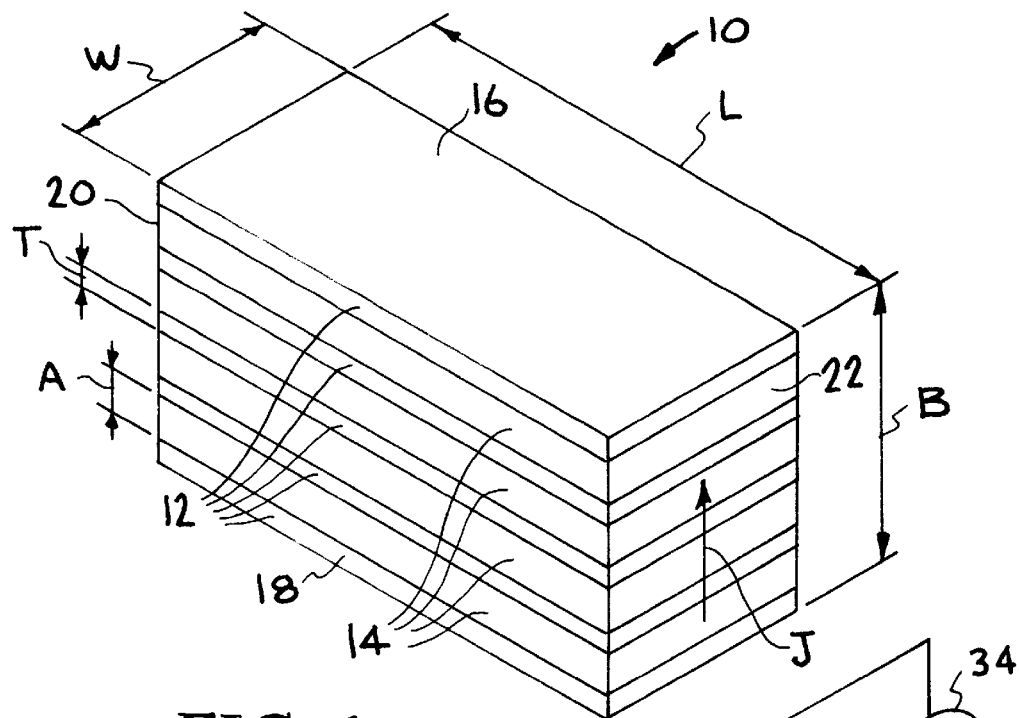
FIG. 1 is a perspective view of a giant magnetoresistive sensor of the present invention having a rectangular configuration.

The giant magnetoresistive sensor (GMR) of the invention is comprised of a multilayered film patterned into a micro-element as shown in FIG. 1. The materials, dimensions (L, W, T, A, B), and shape of the micro-sensor element are key to the optimization of its performance as a practical giant magnetoresistive sensor with large signal response $$\left(\frac{\Delta R}{R}\right),$$

high sensitivity $$\left\{\left(\frac{\Delta R}{R}\right)/H_{sat}\right\},$$

and high spatial resolution. As shown in FIG. 1, GMR sensor element 10 is formed of a 3-dimensional microstructure of alternating magnetic material layers 12 and nonmagnetic material (spacer) layers 14. Layers 12 have a thickness T and layers 14 have a thickness A. Although all layers 12 can be made of the same magnetic material and all layers 14 of the same nonmagnetic material, different nonmagnetic and magnetic materials could be used for different layers of a sensor, and all magnetic layers need not have the same thickness T and all nonmagnetic layers need not have the same thickness A. The sensor element has a length L and width W and total thickness B. The magnetic layers 12 have a size (L×W×T) so that they exhibit the properties of single magnetic domains.

The invention is intended to include but is not restricted to the following illustrative embodiments of a giant magnetoresistive sensor. The multilayered film is typically comprised of N layers of alternately magnetic and non-magnetic materials. However, additional layers of other materials, e.g. barrier layers, may be incorporated into the sensor design as shown in FIGS. 3A, B wherein the layer 14 of FIG. 1 is replaced by layers 14a, 14b. N may be a number as small as 3 (i.e. two magnetic layers separated by one spacer layer) or as many as 400 or more. The total thickness B is typically between 15 nm and 1000 nm. The thickness of the individual spacer layers may range from as small as 0.1 nm to as large as 100 nm. Generally, the spacer layer thickness is sufficiently large that the exchange coupling between adjacent ferromagnetic layers is smaller than the magnetostatic coupling. Thus, for a specific choice of materials and for a sufficiently thick spacer, the magnetoresistive sensitivity of the sensor will not be strongly dependent on the choice of the spacer thickness (A). The magnetic layers may have thickness between 0.1 nm and 100 nm. The materials used for the magnetic layers include but are not restricted to Cobalt, Nickel, Iron, and magnetic alloys such as permalloy. The materials used for the non-magnetic layers include but are not restricted to Copper, Silver, Gold or other non-magnetic conductors. The layers are typically patterned into an asymmetric shape as shown in FIG. 1. The asymmetric shape shown is preferable for some applications but the invention is not restricted to a rectangular form. For example, the shape could be elliptical or trapezoidal. The length L and width W are typically the longest and widest dimensions. The length to width ratio of the pattern will typically be greater than 1. However, the symmetric case of L=W is also important, e.g. square and circular shapes, and forms a part of the invention. In addition, very large length/width ratios (as great as 50:1) are also possible for some applications. In general, in referring to FIG. 1 the pattern dimensions would satisfy L≧W>B>T and W>>T.

Performance Fundamentals

The giant magnetoresistive sensor elements produced by the invention are different from other multilayered GMR sensors in that they are typically patterned in asymmetric shapes (L larger than W) on sub-domain scale sizes (e.g., W<5 μm). However, for some applications the sensor element can also have L=W. The performance characteristics of these giant magnetoresistive sensors arise from a combination of shape anisotropy, small size and the magnetostatic interactions between the layers. The anisotropic shape of the sensor provides an "easy" axis or preferred axis along the long (L) direction for alignment of the magnetization in the individual ferromagnetic layers. The small sub-domain size of the ferromagnetic layers in the structure (L≧W <5 μm and W>>T) forces each ferromagnetic layer to behave as a single magnetic domain. The thickness of the spacer layers (A) in the structure is great enough that the exchange coupling between ferromagnetic layers is smaller than the magnetostatic interactions between the layers. The advantage of this sensor architecture is that under conditions of zero field each ferromagnetic layer will have a magnetization aligned along the long axis direction (anisotropy), and the magnetization of adjacent layers will be anti-parallel because of the magnetostatic coupling. The strength of the magnetostatic coupling will be dependent on (T/L), so that thin, long layers will have a weak magnetostatic coupling which can be easily overcome with a modest applied $H_{sat}$. Thus the sensor can be switched from an anti-parallel magnetization configuration to a parallel magnetization configuration $$\left(\text{maximum}\frac{\Delta R}{R}\right)$$

with a modest applied field, $H_{sat}$, thereby providing the opportunity for both large magnetoresistive response $$\left(\frac{\Delta R}{R}\right)$$

and a high magnetoresistive sensitivity $$\left\{\left(\frac{\Delta R}{R}\right)/H_{sat}\right\},$$

exceeding that of conventional magnetoresistive sensors.

The smaller the lateral dimension (W) of the sensor, the more it will behave as a single magnetic domain with uniaxial properties and the better its expected magnetoresistive response and sensitivity. Thus, as sensor size is decreased to improve spatial localization (resolution) of its measurement, it is expected that its magnetoresistive performance will also improve.

Direction of Current Flow:

While the sensor architecture would provide a large magnetoresistive response for current flowing either parallel to the plane of the layers (current in plane-CIP), or perpendicular to the plane of the layers (current flow perpendicular to plane-CPP), current perpendicular to the plane (CPP) provides certain advantages for sensor response and packaging that may be useful in a variety of applications. This invention is specifically intended to cover CPP—current flow (J) perpendicular to the plane—utilization of the sensor as shown in FIG. 1. Conductive layers or electrodes can be formed on (top) lateral face 16 and opposed (bottom) lateral face 18 to provide CPP current flow.

However, sensor element 10 can be operated in CIP mode by placing a pair of spaced electrodes/contacts on a single lateral surface (16 or 18) or by placing the electrodes/contacts on opposed edge faces, e.g., 20 and 22 as shown in FIG. 3.

As reported in Physical Review Letters Vol. 66, Number 23, Jun. 10, 1991, pages 3060 to 3063, current flow in the CPP direction gives a greater magnetoresistive response than current flow in the CIP direction. CPP utilization also allows easy attachment of current leads to the sensor at the top and bottom of the multilayered stack (surfaces 16, 18). Such leads will facilitate the application of input current to the sensor and the retrieval of output signals from the sensor. The CPP utilization also simplifies the fabrication of current contacts at the top and bottom of the multilayered stack.

The CPP mode of utilization of the sensor has advantages with regard to the use of the sensor as an element in a high density read-write head for magnetic information storage and retrieval. In this regard, the giant magnetoresistance sensor film is oriented so that the bias current that is applied to the giant magnetoresistive film is perpendicular to the plane of the film, i.e. in a CPP mode, which allows the metal shields typically used in read-write heads to be used as conductive leads. Thus, many problems of magnetoresistive read-write heads used in the CIP mode, such as problems of topology, electromigration, heating and electrical shorting are virtually eliminated by this design and mode of current utilization.

Applications of the Magnetoresistive Sensor:

The invention includes those applications which specifically benefit from the microarchitecture, small dimensions and/or mode of current utilization (CPP) of this sensor. Specifically it is anticipated that sensor sensitivity should improve as the sensor is reduced in size. Thus, the sensor will have great value in a read/write head structure for high density magnetic information storage and retrieval. Indeed the small sensor size will define a very narrow track width for information storage. Additionally, the CPP current mode should allow for a more compact read/write head assembly, thereby decreasing the linear bit size for stored information down to dimensions almost as small as the film thickness B. In a read/write head, W is typically about 0.1 microns to 2 microns, and B is between 15 nm and 100 nm. The small size and CPP mode of operation of the GMR sensor of the invention allow it to be positioned between the write poles of the read/write head.

Figure 2:
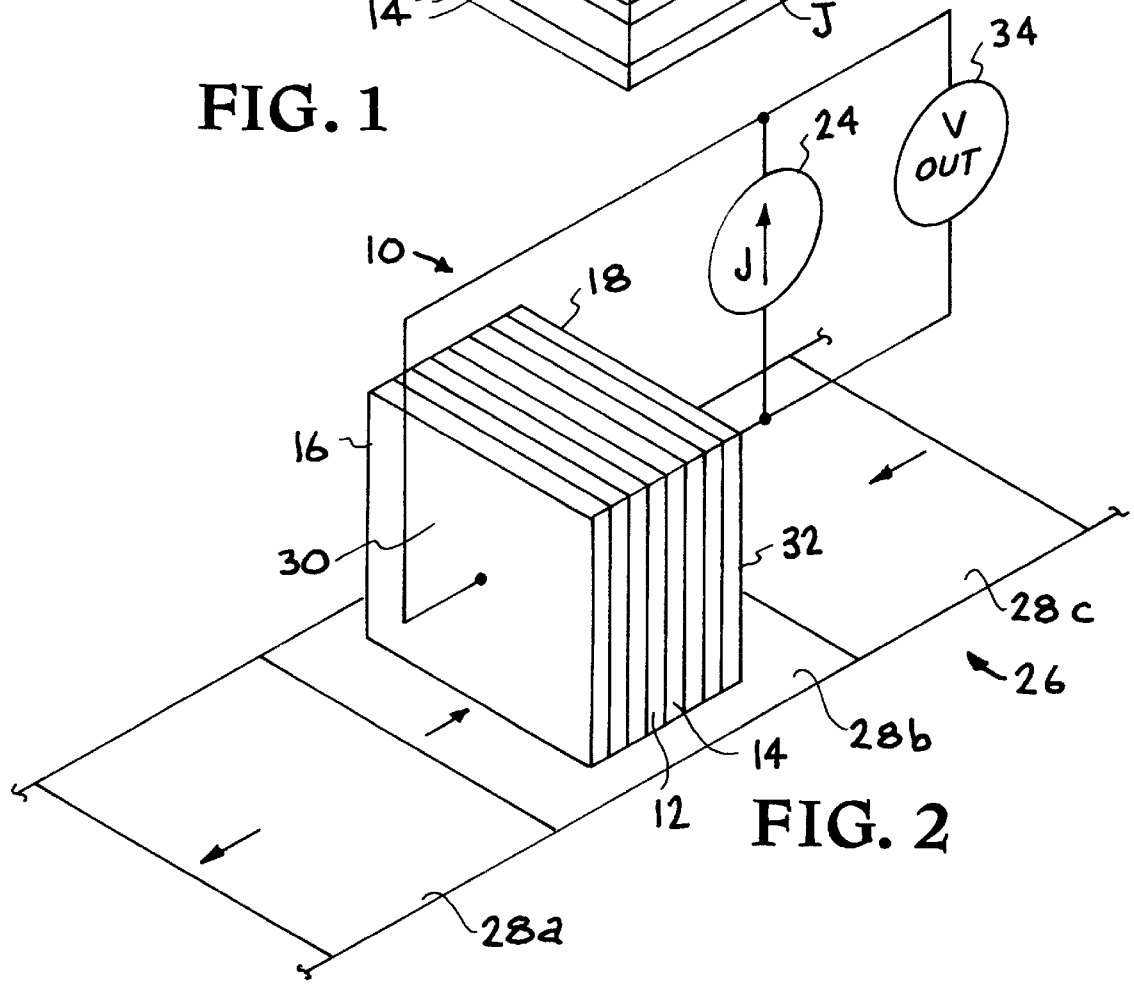
FIG. 2 is a schematic view of the read sensor of a magnetic read/write head using a giant magnetoresistive sensor of the present invention.

An application of the GMR sensor as the read element in a magnetic head is illustrated in FIG. 2. GMR sensor 10, made of alternating layers 12, 14 of magnetic and nonmagnetic material, is connected in CPP mode to current source 24, which is connected to conducting layers or contact pads 30, 32 on lateral faces 16, 18. The conducting layers or contact pads 30, 32 may serve as the magnetic shields for sensor element 10 and may be extended in size if necessary. As GMR sensor element 10 passes over magnetic media 26, the magnetization of each bit 28a, b, c can be read, producing a resistance change or voltage change which is measured by voltmeter 34.

The sensor microarchitecture may be used in a linear analog mode for subsaturation applied fields (i.e. $H<H_{sat}$). However, the sensor microarchitecture also provides an opportunity for digital information recording (i.e. binary signals) for applied fields which saturate the magnetic layers (i.e. $H \geq H_{sat}$).

The high sensitivity and small size of this magnetoresistive sensor will make it valuable for a variety of new applications such as its use as a switch and/or micro-sensor device in automobile, aircraft and other engines, and in rotating components or machines. An array of such sensitive micro-sensors may be used to map the spatially distributed magnetic signature of human brain waves, or to identify metal structures under water or below the earth's surface or to monitor foreign submarine traffic in sensitive waters.

Fabrication of the Magnetoresistive Sensor:

A distinct advantage of this sensor design results from its simple architecture and current utilization mode (CPP) which allow it to be mass produced using existing microfabrication technologies. In particular, large numbers of sensor elements such as shown in FIG. 1 can be parallel processed so that thousands of elements can be fabricated in parallel on a single substrate wafer. In particular, a specific process for the parallel fabrication of many sensors along with their conducting contacts at the top and bottom of the multilayer stack is part of the invention. The fabrication steps are:

1) The process begins with a clean, smooth substrate which may be a silicon wafer or an insulating ceramic or other suitable material.

2) A conducting layer is deposited on the substrate via evaporation, sputtering, chemical vapor deposition, molecular beam epitaxy or plating. Appropriate conducting layers may be copper or gold or silver or iron or other suitable metal layer. This layer serves as the bottom conducting contact pad.

3) A multilayer stack of alternately magnetic and non-magnetic layered materials is then deposited on top of the conducting layer. This deposition may be achieved by alternately depositing the ferromagnetic material and then the conducting material in layer thicknesses T and A respectively. The multilayer deposition may be achieved using magnetron or ion beam sputtering, evaporation or other vapor phase deposition techniques. The thicknesses T and A are optimized for sensor performance. This invention is intended to cover preferred thickness ranges 0.1 nm $<T<100$ nm and 0.1 nm $<A<100$ nm. The total number of layers may be as few as 3 or as many as 400. Additional material layers may be added to this multilayered structure for performance or structural reasons. The types of materials used for the ferromagnetic layers may include Fe or Co or Ni or alloys such as permalloy. The types of materials used for the non-magnetic layer may include Cu, Au, Ag or other non-magnetic conductor.

4) In a step similar to step #2, a conducting layer is deposited on top of the multilayered stack to serve as the top conducting contact pad.

5) The conducting layer in step #4 is coated with a polymer resist material of appropriate thickness. The thickness of the resist layer will typically be ~1 μm, although layers as thin as 0.25 μm and as thick as 20 μm are also possible.

6) The resist layer of step #5 is then exposed using radiation in order to define the lateral geometry of the micro-sensor. The preferred radiation for the exposure is visible or near ultraviolet radiation, although a wide range of radiations can be used to expose the resist including x-rays, deep ultraviolet, electrons or ions. Transfer of the pattern into the resist may be accomplished using a master pattern or reticle mask as is conventionally achieved using projection lithography systems such as the Ultratech Model 2700. For pattern widths (W) of order 1 μm or less either a more sophisticated (and expensive) lithography machine (such as the Nikon TFH-1) machine must be used or an alternative exposure method must be used. For the purposes of this invention a maskless lithographic technique may be used, involving the interference of optical or near UV laser beams to make periodic exposure patterns as described by A. M. Hawryluk in J. Vac. Science Technology Vol. 19, No. 4, November/December 1981, pages 897–900, which is herein incorporated by reference. This technique may be used in two orthogonal exposure steps to define essentially rectangular patterns (L×W) in the resist. This technique may be used to define pattern widths as small as 0.1 μm.

7) After the multilayered stack has been exposed and developed, the resist pattern can be replicated in the multilayer stack by an etching process (using the resist pattern as a protective mask). The etching is preferably achieved using a reactive etch process such as reactive ion etching or reactive ion beam etching. However, other etch processes including liquid etch, chemically assisted ion beam etch, or ion beam sputtering can also be used.

8) After the microsensor pattern is etched the protective resist layer is removed using an appropriate solvent.

9) Finally the microsensor element is released from the substrate. This may be achieved in a number of ways: the substrate may be etched away; a release layer may have been deposited between steps #1 and #2 and then the release layer may be dissolved away. More preferably the micro-sensor fabrication process (steps 2 through 7) may be incorporated with a more extensive fabrication process used to define the architecture of the housing in which the sensor would reside. In such case the sensor release procedure would be over-ridden by the fabrication procedure for the sensor housing. An example of this case would include the incorporation of the sensor into the architecture of a read/write head. In this case, the sensor would be fabricated as an integral part of the structure of the head and no "release" strategy for the sensor would be required.

Changes and modifications in the specifically described embodiments can be carried out without departing from the scope of the invention which is intended to be limited only by the scope of the appended claims.

We claim:

1. A giant magnetoresistive (GMR) sensor, comprising:
   a sensor element formed of a plurality of alternating layers of a magnetic material and a nonmagnetic conducting material patterned in a three-dimensional microarchitecture with a length L and a width W and a total thickness B, wherein L≧W>B and W is between about 0.1 microns and about 5 microns, and wherein each magnetic layer is a single magnetic domain and the layers of nonmagnetic material have a thickness such that exchange coupling between adjacent magnetic layers is less than magnetostatic coupling;
   means for flowing a current through the sensor element and for detecting resistance changes.

2. The sensor of claim 1 wherein each magnetic material layer has a thickness T between about 0.1 nm and about 100 nm and W>>T.

3. The sensor of claim 1 wherein the sensor element is substantially asymmetrically shaped.

4. The sensor of claim 1 wherein the sensor element is substantially rectangular.

5. The sensor of claim 1 wherein the number of layers of magnetic and nonmagnetic material is between 3 and 400.

6. The sensor of claim 1 wherein the magnetic layers are formed of iron, cobalt, nickel or a magnetic alloy.

7. The sensor of claim 1 wherein the nonmagnetic layers are formed of copper, gold, silver or other nonmagnetic conductor.

8. The sensor of claim 1 wherein the L/W ratio is between 1 and 50.

9. The sensor of claim 1 further comprising additional layers of another material.

10. The sensor of claim 1 wherein the sensor element has a thickness B between 15 nm and 1000 nm.

11. The sensor of claim 1 wherein the means for flowing current comprise a pair of electrodes on opposed lateral faces of the sensor element to provide current perpendicular to plane (CPP) current flow.

12. The sensor of claim 1 wherein the means for flowing current comprise a pair of electrodes on a single lateral face or on opposed edge faces of the sensor element to provide current in plane (CIP) current flow.

13. The sensor of claim 4 wherein W is between 0.25 microns and 2 microns, and the sensor element has a thickness between 15 nm and 100 nm.

14. A giant magnetoresistive (GMR) sensor, comprising:
   a sensor element formed of a plurality of alternating layers of a magnetic material and a nonmagnetic material patterned in a three-dimensional microarchitecture with a length L and a width W and a total thickness B, wherein L≧W>B and W is between about 0.1 microns and about 5 microns, and wherein each magnetic layer is a single magnetic domain and the layers of nonmagnetic material have a thickness such that exchange coupling between adjacent magnetic layers is less than magnetostatic coupling;
   conductive layers formed on a pair of opposed lateral faces of the sensor element for flowing a current through the sensor element in a current perpendicular to plane (CPP) mode and for detecting resistance changes.

15. The sensor of claim 14 wherein the sensor element is substantially rectangular shaped.

16. The sensor of claim 15 wherein W is between 0.25 microns and 2 microns, and the sensor element has a thickness between 15 nm and 100 nm.

17. The sensor of claim 14 wherein the conductive layers on opposed lateral faces of the sensor element are magnetic shields for the sensor element.

18. The sensor of claim 14 wherein the magnetic layers are formed of iron, cobalt, nickel or a magnetic alloy.

19. The sensor of claim 14 wherein the nonmagnetic layers are formed of copper, gold, silver or other nonmagnetic conductor.

* * * * *